United States Patent
Castillo Magcale et al.

(10) Patent No.: US 11,882,677 B1
(45) Date of Patent: *Jan. 23, 2024

(54) DATA CENTER FACILITY

(71) Applicant: Nautilus TRUE, LLC, Pleasanton, CA (US)

(72) Inventors: Arnold Castillo Magcale, San Ramon, CA (US); Daniel Kekai, San Ramon, CA (US); Byron Putnam Taylor, San Jose, CA (US)

(73) Assignee: Nautilus TRUE, LLC, San Ramon, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/588,363

(22) Filed: Jan. 31, 2022

Related U.S. Application Data

(63) Continuation of application No. 14/591,249, filed on Jan. 7, 2015, now Pat. No. 11,246,243.
(Continued)

(51) Int. Cl.
*H05K 7/20* (2006.01)
*B63B 35/44* (2006.01)
(Continued)

(52) U.S. Cl.
CPC ........... *H05K 7/2079* (2013.01); *B63B 35/44* (2013.01); *B63J 2/12* (2013.01); *G06F 1/20* (2013.01);
(Continued)

(58) Field of Classification Search
CPC ...... G06F 1/203; G06F 1/20; G06F 2200/201; H05K 7/2079; H05K 7/1497; H02J 7/35;
(Continued)

(56) References Cited

U.S. PATENT DOCUMENTS

| 6,212,895 B1 | 4/2001 | Richardson |
| 6,990,395 B2 | 1/2006 | Ransom et al. |

(Continued)

FOREIGN PATENT DOCUMENTS

| JP | 2010269641 A | 12/2010 |
| RU | 2432491 C2 | 10/2011 |

(Continued)

OTHER PUBLICATIONS

Cole. Data Center Infrastructure Management (DCM). Data Center Knowledge. (Website.) Mar. 2013. Retrieved at URL: http://www.nolimitssoftware.com/wp-content/uploads/2013/03/DCIM-Guide.pdf. 17 pages.

(Continued)

*Primary Examiner* — James Wu
*Assistant Examiner* — Hung Q Dang
(74) *Attorney, Agent, or Firm* — Wilson Sonsini Goodrich & Rosati

(57) ABSTRACT

Waterborne data center facility systems and methods comprising a purpose-built marine vessel, a pre-fabricated data center facility structure, a plurality of computer systems, a plurality of energy-efficient water-based heat exchange systems, a plurality of energy efficient closed-loop cooling systems, a plurality of data center modules and a plurality of electrical power generators. Described systems and methods may be employed to quickly deploy an energy-efficient waterborne data center facility. Described waterborne data center facility is transportable and may be moved to areas where data center facility and data center type services are needed. Water-based heat exchange and closed-loop cooling system enable energy-efficient cooling to data center facility and the plurality of computing systems therein. Power generators may be used to provide power to data center facility. Waterborne data center facility may prove helpful in (Continued)

Side View areas following natural disasters or for military purposes where data center services are needed but not readily available.

13 Claims, 2 Drawing Sheets

Related U.S. Application Data

(60) Provisional application No. 61/925,071, filed on Jan. 8, 2014.

(51) Int. Cl.
*B63J 2/12* (2006.01)
*G06F 1/20* (2006.01)
*H05K 7/14* (2006.01)
*H02J 7/35* (2006.01)

(52) U.S. Cl.
CPC .............. *H02J 7/35* (2013.01); *H05K 7/1497* (2013.01); *B63B 2035/4426* (2013.01); *G06F 2200/201* (2013.01); *Y02T 70/00* (2013.01)

(58) Field of Classification Search
CPC .... B63B 35/44; B63B 2035/4426; B63J 2/12; Y02T 70/00
See application file for complete search history.

(56) References Cited

U.S. PATENT DOCUMENTS

| | | | |
|---|---|---|---|
| 7,058,710 | B2 | 6/2006 | McCall et al. |
| 7,278,273 | B1 | 10/2007 | Whitted et al. |
| 7,525,207 | B2 | 4/2009 | Clidaras et al. |
| 7,738,251 | B2 | 6/2010 | Clidaras et al. |
| 8,359,191 | B2 | 1/2013 | Chen et al. |
| 8,853,872 | B2 * | 10/2014 | Clidaras ............... H05K 7/1497 290/43 |
| 11,246,243 | B2 | 2/2022 | Magcale et al. |
| 2002/0010709 | A1 | 1/2002 | Culbert et al. |
| 2006/0259201 | A1 | 11/2006 | Brown |
| 2007/0213000 | A1 | 9/2007 | Day |
| 2007/0281639 | A1 | 12/2007 | Clidaras et al. |
| 2008/0209234 | A1 | 8/2008 | Clidaras et al. |
| 2009/0037268 | A1 | 2/2009 | Zaid et al. |
| 2009/0083126 | A1 | 3/2009 | Koren et al. |
| 2009/0084297 | A1 | 4/2009 | Choi et al. |
| 2009/0126910 | A1 | 5/2009 | Campbell et al. |
| 2009/0207567 | A1 | 8/2009 | Campbell et al. |
| 2009/0295167 | A1 | 12/2009 | Clidaras et al. |
| 2009/0299824 | A1 | 12/2009 | Barnes, Jr. |
| 2010/0030552 | A1 | 2/2010 | Chen et al. |
| 2010/0298997 | A1 | 11/2010 | Ohba et al. |
| 2011/0060470 | A1 | 3/2011 | Campbell et al. |
| 2011/0072293 | A1 | 3/2011 | Mazzaferri et al. |
| 2011/0207391 | A1 | 8/2011 | Hamburgen et al. |
| 2012/0042263 | A1 | 2/2012 | Rapaport et al. |
| 2012/0136998 | A1 | 5/2012 | Hough et al. |
| 2012/0166433 | A1 | 6/2012 | Tseng |
| 2012/0166616 | A1 | 6/2012 | Meehan et al. |
| 2013/0238795 | A1 | 9/2013 | Geffin et al. |
| 2014/0259618 | A1 | 9/2014 | Damus et al. |

FOREIGN PATENT DOCUMENTS

| | | |
|---|---|---|
| WO | WO-0048288 A1 | 8/2000 |
| WO | WO-2009055368 A3 | 3/2010 |
| WO | WO-2010129341 A1 | 11/2010 |
| WO | WO-2012047746 A3 | 5/2012 |
| WO | WO-2013113138 A1 | 8/2013 |
| WO | WO-2015106034 A1 | 7/2015 |

OTHER PUBLICATIONS

PCT/US2015/010699 International Search Report and Written Opinion dated Month Jul. 16, 2015.
U.S. Appl. No. 14/591,249 Notice of Allowance dated Aug. 27, 2021.
U.S. Appl. No. 14/591,249 Office Action dated Aug. 26, 2020.
U.S. Appl. No. 14/591,249 Office Action dated Dec. 31, 2020.
U.S. Appl. No. 14/591,249 Office Action dated Feb. 10, 2020.
U.S. Appl. No. 14/591,249 Office Action dated Feb. 8, 2019.
U.S. Appl. No. 14/591,249 Office Action dated Jul. 18, 2018.
U.S. Appl. No. 14/591,249 Office Action dated Nov. 2, 2017.
U.S. Appl. No. 14/591,249 Office Action dated Nov. 22, 2016.

* cited by examiner

Side View

Top Cutaway View — Below Main Deck

Top View

DATA CENTER FACILITY

CROSS REFERENCE TO RELATED APPLICATIONS

This application is a continuation to application Ser. No. 14/591,249 filed on Jan. 7th 2015, entitled "A WATERBORNE DATA CENTER FACILITY" which in turn claims reference to Provisional Patent application No. 61/925,071 filed on Jan. 8, 2014, entitled "A WATERBORNE DATA CENTER FACILITY".

BACKGROUND

Problem Solved: A data center is a facility designed to house, maintain, and power a plurality of computer systems. The computer systems within the data center are generally rack-mounted where a number of electronics units are stacked within a support frame. The data center is designed to maintain interior ambient conditions suitable for proper operation of the computer systems therein.

A key constraint of the data center is cooling capacity. Each watt consumed by the computer systems is a watt of waste heat that must be removed to maintain suitable operating temperature. As the power density of computer systems increases data center power and cooling efficiency has become critical. Conventional data centers supporting such high density can quickly outstrip power and cooling capabilities.

A conventional data center is constructed entirely on-site and is neither transportable, nor re-configurable. Installation of electrical, mechanical and cooling equipment must be performed on-site after construction of the data center facility is completed. Design and deployment of a standard data center requires extensive time in planning and construction, with commensurate financial expense. A data center build cycle from concept to operation may take two years to complete.

Data center providers struggle to support high-density power and cooling demands. A large percentage of current data centers employ inefficient cooling systems. These inefficient cooling systems may account for half of the total power consumed in the data center.

The described waterborne data center facility systems and methods may employ an energy-efficient water-based closed-loop cooling system that uses naturally occurring cold water to cool the data center and the plurality of computer systems therein. This results in considerably less power consumed to maintain interior ambient conditions suitable for proper operation of the computer systems housed in the data center.

The waterborne data center facility may be deployed in a modular fashion using data center modules, resulting in dramatically shortened deployment times. In general, these data center modules house a plurality of support frames to install rack-mounted computer systems. The data center modules may also include water-based cooling units that will be connected to the water-based closed-loop cooling system. The data center modules may also include electrical systems and mechanical systems.

DETAILED DESCRIPTION

Figure 1:
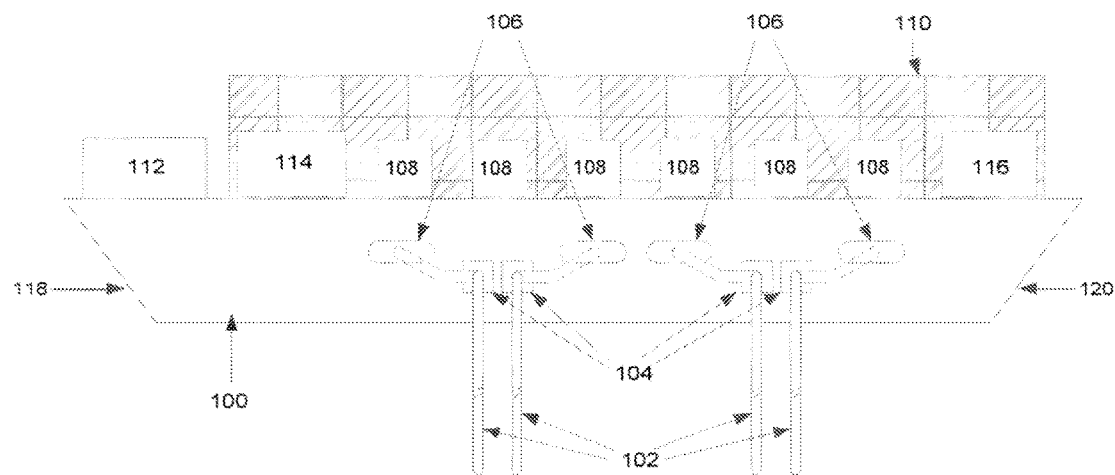
FIG. 1 shows a side view of the waterborne data center facility.

As stated above, a data center is a facility designed to house, maintain, and power a plurality of computer systems. The computer systems within the data center are generally rack-mounted where a number of electronics units are stacked within a support frame. The data center is designed to maintain interior ambient conditions suitable for proper operation of the computer systems therein.

A key constraint of the data center is cooling capacity. Each watt consumed by the computer systems is a watt of waste heat that must be removed to maintain suitable operating temperature. As the power density of computer systems increases data center power and cooling efficiency has become critical. Conventional data centers supporting such high density can quickly outstrip power and cooling capabilities.

A conventional data center is constructed entirely on-site and is neither transportable, nor re-configurable. Installation of electrical, mechanical and cooling equipment must be performed on-site after construction of the data center facility is completed. Design and deployment of a standard data center requires extensive time in planning and construction, with commensurate financial expense. A data center build cycle from concept to operational may take two years to complete. The invention claimed here solves this problem.

Embodiments disclosed include waterborne data center facility systems and methods capable of being quickly employed. Embodiments disclosed further include a quickly deployable energy-efficient data center thereby drastically reducing build cycle time for a data center from start to fully operational. According to an embodiment, the described waterborne data center facility comprises a plurality of water-based closed-loop cooling systems and a plurality of water-based heat exchange systems using naturally occurring cold water to efficiently cool a plurality of high-density computer systems housed in the data center. Preferably, the waterborne data center facility is designed to be transportable and may be moved to areas needing a data center and data center services.

Embodiments disclosed include an improved, energy efficient waterborne data center facility. The disclosed embodiments include superior, energy efficient systems and methods as compared to existing systems. The described waterborne data center facility requires considerably less time to deploy compared to conventional data centers. The waterborne data center facility can be transported to other areas to quickly provide a data center and data center services. The ability to be transported may be useful in areas following natural disasters or for military deployments. According to an embodiment, the waterborne data center facility comprises an energy-efficient cooling system comprising water-based heat exchangers using naturally cold water as a heat sink with a water-based closed-loop cooling system to cool the plurality of computer systems therein.

A high percentage of existing data centers employ inefficient power and cooling systems. These inefficiencies prohibit support of high-density computing and can double the amount of power required to maintain interior ambient conditions suitable for proper operation of the computer systems therein.

A conventional data center is constructed entirely on-site and is not re-configurable. Upgrading conventional data centers requires extensive time in planning and construction, with commensurate financial expense. A data center build cycle from concept to operational deployment may take two years to complete.

According to an embodiment, the described waterborne data center facility systems and methods comprise an energy-efficient water-based closed-loop cooling system that uses naturally occurring cold water to cool the data center and the plurality of computer systems housed therein. This results in considerably less power consumed to maintain interior ambient conditions suitable for proper operation of the computer systems housed in the data center.

In preferred embodiments, the waterborne data center facility can be deployed in a modular fashion using data center modules, resulting in dramatically shortened deployment times. In general, these data center modules house a plurality of support frames to install rack-mounted computer systems.

The data center modules may also include water-based cooling units that will be connected to the water-based closed-loop cooling system. The data center modules may also include electrical systems and mechanical systems.

Relation Between the Components

One embodiment of the waterborne data center facility is shown in FIG. 1, (side view) FIG. 2 (cutaway below main deck view) and FIG. 3 (top view).

FIG. 1 shows a side view of the waterborne data center facility comprised of a purpose-built marine vessel 100 using a water-based closed-looped cooling system that maybe comprised of a plurality filtered water intake pipes 102, a plurality water pumps 104, a plurality of closed-loop cooling distribution units 116 and a plurality heat exchangers 106. The data center facility 110 may contain a plurality computer systems installed in racks or data center modules 108. The data center facility and all included computer systems may be powered by a plurality of generators 112. Electrical equipment will be installed in the electrical switch room 114. In another embodiment, the water intake pipes 102 may be installed in the bow (front) or stern (back) section of the purpose-built marine vessel instead of on the starboard (right) or port (left) sides of the vessel.

Figure 2:
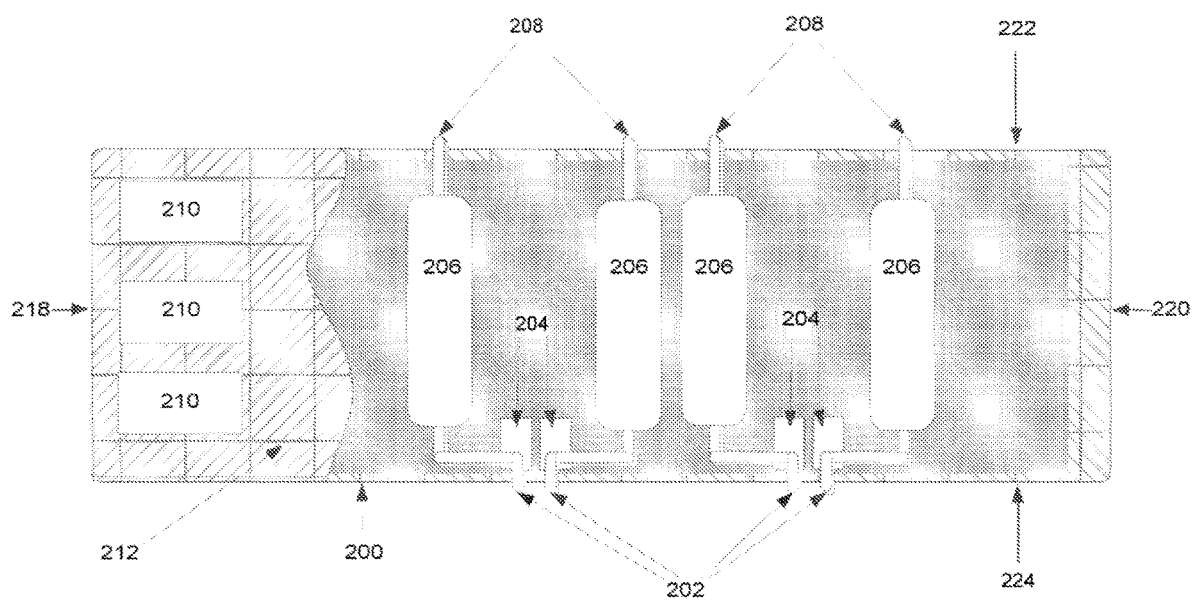
FIG. 2 shows a cutaway top view of the waterborne data center facility.

FIG. 2 shows a cutaway top view of the waterborne data center facility. The water-based closed-looped cooling system equipment installed below the main deck of the purpose-built marine vessel 200 may include a plurality of filtered intake water pipes 202, a plurality water pumps 204, a plurality heat exchangers 206, a plurality of generators installed on the main deck 212 and a plurality of filtered water exhaust pipes 208. In another embodiment, the water intake pipes 202 and water exhaust pipes 208 may be installed in the bow (front) or stern (back) section of the purpose-built marine vessel instead of on the starboard (right) or port (left) sides of the vessel.

Figure 3:
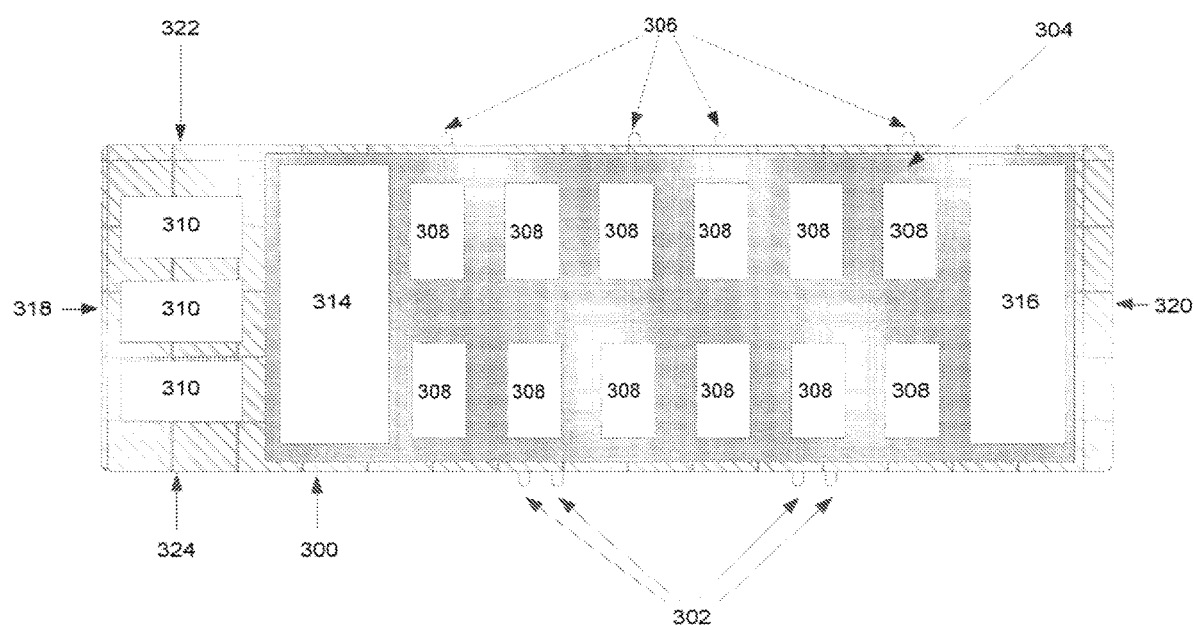
FIG. 3 shows a top view of the waterborne data center facility.

FIG. 3 shows a top view of the waterborne data center facility comprised of a purpose-built marine vessel 300, a plurality of filtered water intake pipes 302, a plurality of filtered water exhaust pipes 304, a data center facility 304, a plurality of computing systems that may be installed in data center modules 308, a plurality of generators 310, an electrical switch room 314 and a plurality of closed-loop distribution units. The data center facility 304 and all included computing systems may be powered by a plurality of generators 310 or from a land based power source (not shown).

How the Invention Works

Embodiments disclosed include systems and methods for deploying and implementing a waterborne data center facility, which facility in general comprises a purpose-built marine vessel 100, and a data center facility 110 that houses a plurality of computing systems. According to an embodiment, the heat generated by the computing systems is absorbed by the energy-efficient water-based closed-loop cooling system described above. The water-based closed-loop cooling system comprises a plurality of filtered water intake pipes 102, a plurality of water pumps 104, a plurality of heat exchangers 106 and closed-loop cooling distribution units 116 that may use freshwater as a coolant. The data center facility 110 and all included computing systems may be powered by a plurality of generators 112 or from a land based power source (not shown).

Naturally cold water may be drawn through filtered water intake pipes 102 by water pumps 104. The naturally cold water may then be pumped through one side of the heat exchangers 106 where it serves as a heat sink to cool the hot coolant from the closed-loop cooling distribution unit 116 being pumped through the other side of the heat exchangers 106. Naturally cold water that has been pumped into the waterborne data center facility may be expelled from the waterborne data center facility by a plurality of pumps 204 through filtered water exhaust pipes 208. The closed-loop cooling distribution units 116 may use freshwater as a coolant. The closed-loop cooling distribution unit 116 may pump the coolant to the data center modules 108 cooling units (not pictured) where it absorbs heat generated by the plurality of computing systems therein. The heated coolant may then be passed through one side of the heat exchangers 106 while naturally cold water is being passed through the other side of the heat exchanger 106 absorbing the heat from the coolant.

Power may be delivered to the waterborne data center facility from a land based source. The waterborne data center facility may also be powered by a plurality of generators 108. Other possible power sources are solar panels, wind turbines and fuel cells. Electrical equipment may be installed in the electrical switch room 114. Other alternatives, variations, combinations and modifications are possible, and in some instances, desirable, as would be apparent to a person having ordinary skill in the art.

How to Make Invention

According to an embodiment, the purpose built marine vessel is designed to comprise a heat exchange system to support the cooling system. The cooling system may be a closed loop water based cooling system, but other possible non-closed loop, non-water based cooling systems may be implemented, as would be apparent to a person having ordinary skill in the art. In an embodiment, the heat exchange system is comprised in the hull of the purpose built marine vessel, or the hull itself is so designed as to function both as a hull and as a heat exchanger. Electrical, mechanical and cooling equipment is installed in the purposed built marine vessel. Additionally, the purpose built marine vessel includes a means to provide and deliver power and network connectivity to the data center facility. Power may be produced on board the marine vessel, or alternatively may be received from an external source. Network connectivity may be wired or wireless.

Preferred embodiments include all of the above mentioned elements. Alternate embodiments utilize renewable energy sources such as solar photovoltaic, solar thermal, wind energy, tidal wave energy, thermal energy, fuel cells, etc. which can be leveraged for additional energy efficiency. Yet other embodiments use power transmitted from another marine vessel, and from land based power sources. Additionally, heat from the exhaust air or hot water return from the water based cooling system could also be used as a renewable energy source or used as part of a waste heat system.

According to alternate embodiments, the waterborne data center facility may use a refrigerant coolant with the closed-loop cooling system instead of freshwater. Also, according to an embodiment, the filtered water intake pipes and filtered water exhaust pipes may be installed in the bow (front) or stern (back) section of the purpose-built marine vessel instead of on the starboard (right) or port (left) sides of the vessel.

The described water-based closed-loop cooling system can be used in office buildings, residential homes, schools, government buildings, cruise ships, naval vessels, mobile homes, temporary work sites, remote work sites, hospitals, apartment buildings, etc. Other variations, modifications, and applications are possible, as would be apparent to a person having ordinary skill in the art.

How to Use the Invention

Additionally, partial or complete embodiments of the disclosed invention can be utilized in alternate applications without departing from the scope and spirit of the disclosure. For example, in an embodiment, one would simply install their computer systems in the waterborne data center facility. The waterborne data center facility may be quickly deployed to areas following natural disasters to provide data center facility services to the area. The waterborne data center facility may be deployed for military purposes. The waterborne data center facility may be deployed in areas that lack such data center infrastructure or where it is difficult to build such data center infrastructure. Additionally and alternatively, embodiments of the systems and methods described above may be used for a transportable hospital that could then be deployed to areas following natural disasters or for military purposes. Other embodiments may be used for a transportable office structure instead of a data center facility.

In yet another embodiment the systems and methods may be used for a transportable waterborne power plant, comprising a purpose-built marine vessel and a plurality of generators or fuel cells used to produce power. This may be useful in areas following natural disasters or for military purposes.

Since various possible embodiments might be made of the above invention, and since various changes might be made in the embodiments above set forth, it is to be understood that all matter herein described or shown in the accompanying drawings is to be interpreted as illustrative and not to be considered in a limiting sense. Thus it will be understood by those skilled in the art of water borne vessels, and computer data centers and that although the preferred and alternate embodiments have been shown and described in accordance with the Patent Statutes, the invention is not limited thereto or thereby.

The figures illustrate the architecture, functionality, and operation of possible implementations of systems, methods and computer program products according to various embodiments of the present invention. It should also be noted that, in some alternative implementations, the functions noted/illustrated may occur out of the order noted in the figures. For example, two blocks shown in succession may, in fact, be executed substantially concurrently, or the blocks may sometimes be executed in the reverse order, depending upon the functionality involved.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Some portions of embodiments disclosed are implemented as a program product for use with an embedded processor. The program(s) of the program product defines functions of the embodiments (including the methods described herein) and can be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive, solid state disk drive, etc.); and (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-accessible format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

The present invention and some of its advantages have been described in detail for some embodiments. It should be understood that although the system and process is described with reference to a water borne data center, the system and process may be used in other contexts as well. It should also be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. A person having ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

We claim:

1. A cooling facility comprising:
   a heat exchange system comprising a single or plurality of heat exchangers and operatively coupled to a heat generating source;
   a water based cooling system operatively coupled to the heat exchange system and comprising: a first and second single or plurality of filtered water pipes;
   a single or plurality of water pumps operatively coupled to at least one of the first and second single or plurality of filtered water pipes;
   wherein the first single or plurality of filtered water pipes reversibly operate as water intake and water exhaust pipes and the second single or plurality of filtered water pipes reversibly operate as water intake and water exhaust pipes with aid of the single or plurality of water pumps, wherein the first single or plurality of filtered pipes and the second single or plurality of filtered water pipes are positioned on opposing sides of the cooling facility and extend into a water source;
   wherein the first and second single or plurality of filtered water pipes are: (i) operatively connected to a corresponding heat exchanger of the single or plurality of heat exchangers such that the first and second single or plurality of filtered water pipes are coupled to a first side of the single or plurality of exchangers comprised in the heat exchange system; a closed-loop cooling distribution unit coupled to a second side of the single or plurality of heat exchangers comprised in the heat exchange system; and wherein the first and second single or plurality of filtered water pipes are configured for intake and exhaust of water from the water source.

2. The cooling facility of claim 1 wherein the cooling facility is comprised in a marine vessel comprising a hull, a front (bow) section, a back (stern) section, a right (starboard) section, and a left (port) section.

3. The cooling facility of 1 wherein the heat generating source comprises: a computer data center comprising a plurality of computing units installed in a plurality of data center modules and housed in a marine vessel; and a single or plurality of electrical power generators connected to the computer data center and operatively coupled to the heat exchange system.

4. The marine vessel of claim 2, wherein the water based cooling system is installed below a main deck of the marine vessel.

5. The marine vessel of claim 2, wherein the filtered water intake pipes and the filtered water exhaust pipes are comprised in the front or back section of the marine vessel.

6. The marine vessel of claim 2, wherein the filtered water intake pipes and the filtered water exhaust pipes are comprised in the right or left sections of the vessel.

7. The cooling facility of claim 3, wherein the single or plurality of electrical power generators further comprise at least one of a single or plurality of solar panels, a single or plurality of wind turbines, and a single or plurality of fuel cells.

8. The cooling facility of claim 3, further comprising an electrical switch room for control and management of electrical equipment.

9. The cooling facility of claim 1 wherein the closed-loop cooling distribution unit coupled to the second side of the single or plurality of heat exchangers comprised in the heat exchange system contains a refrigerant comprising a liquid nitrogen.

10. A cooling facility comprising:
    a computer data center comprising a plurality of computing units installed in a single or plurality of data center modules;
    a heat exchange system comprising a single or plurality of heat exchangers and operatively coupled to each of a plurality of heat generating sources;
    the corresponding single or plurality of data center modules comprised in the computer data center;
    a water based cooling system operatively coupled to the heat exchange system and comprising: a first and second single or plurality of filtered water pipes;
    a single or plurality of water pumps operatively coupled to at least one of the first and second single or plurality of filtered water pipes;
    wherein the first single or plurality of filtered water pipes reversibly operate as water intake and water exhaust pipes and the second single or plurality of filtered water pipes reversibly operate as water intake and water exhaust pipes with aid of the single or plurality of water pumps, wherein the first single or plurality of filtered pipes and the second single or plurality of filtered water pipes are positioned on opposing sides of the cooling facility and extend into a water source;
    wherein the first and second single or plurality of filtered water pipes are: (i) operatively connected to a respective heat exchanger of the plurality of heat exchangers such that the first and second single or plurality of filtered water pipes are coupled to a first side of the single or plurality of exchangers comprised in the heat exchange system; and a closed-loop cooling distribution unit coupled to a second side of the single or plurality of heat exchangers comprised in the heat exchange system.

11. The cooling facility of claim 10 wherein: the plurality of heat generating sources comprise: a plurality of computing units installed in a single or plurality of data center modules of the computer data center; or a plurality of electrical power generators connected to the computer data center facility.

12. The cooling facility of claim 10 further comprising:
    a marine vessel which comprises a hull, a bow section, a stern section, a starboard section, and a port section; and
    wherein the computer data center comprises the plurality of computing units installed in the plurality of data center modules are housed in the marine vessel.

13. The cooling facility of claim 10 wherein the closed-loop cooling distribution unit coupled to the second side of the single or plurality of heat exchangers comprised in the heat exchange system contains a refrigerant comprising a liquid nitrogen.

* * * * *